US 12,446,312 B2

(12) United States Patent
Xu et al.

(10) Patent No.: US 12,446,312 B2
(45) Date of Patent: Oct. 14, 2025

(54) DISPLAY PANEL AND DISPLAY DEVICE

(71) Applicant: WUHAN CHINA STAR OPTOELECTRONICS TECHNOLOGY CO., LTD., Hubei (CN)

(72) Inventors: Zuoyuan Xu, Hubei (CN); Nian Hu, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 17/754,897

(22) PCT Filed: Mar. 14, 2022

(86) PCT No.: PCT/CN2022/080587
§ 371 (c)(1),
(2) Date: Apr. 15, 2022

(87) PCT Pub. No.: WO2023/168723
PCT Pub. Date: Sep. 14, 2023

(65) Prior Publication Data
US 2024/0120344 A1    Apr. 11, 2024

(30) Foreign Application Priority Data
Mar. 7, 2022    (CN) .......................... 202210215186.7

(51) Int. Cl.
*H10D 86/60*    (2025.01)
*G09F 9/30*    (2006.01)
*H10D 86/40*    (2025.01)

(52) U.S. Cl.
CPC .......... *H10D 86/60* (2025.01); *H10D 86/441* (2025.01)

(58) Field of Classification Search
CPC .......... H01L 27/124; G09F 9/30; G09F 9/35; G09G 3/20; G02F 1/1345
See application file for complete search history.

(56) References Cited

U.S. PATENT DOCUMENTS 7,705,952 B2    4/2010    Lee et al.
10,504,931 B2 *    12/2019    Zhou .................... H10D 86/441
(Continued)

FOREIGN PATENT DOCUMENTS

CN    101510383 A *    8/2009
CN    102323681 A    1/2012
(Continued)

OTHER PUBLICATIONS

CN_101510383_A_I-English (Year: 2009).*
(Continued)

*Primary Examiner* — Yara B Green
*Assistant Examiner* — Akhee Sarker-Nag
(74) *Attorney, Agent, or Firm* — PV IP PC; Wei Te Chung

(57) ABSTRACT

Embodiments of the present disclosure are directed to a display panel and a display device. A width of the fan-out wire positioned at the outer side is increased such that the impedance of the outer fan-out wire could be reduced. Furthermore, the second part of the second fan-out wire is bended in a direction away from the display region. This means that the second part only occupies the right/left redundant space and thus the second fan-out wire consumes less space of the lower side frame and the width of the fan-out region decreases. The present disclosure could achieve both comparatively low impedance of the fan-out wire and a narrow side frame.

19 Claims, 4 Drawing Sheets

(56) References Cited

U.S. PATENT DOCUMENTS

2020/0272007 A1* 8/2020 Yang ................ G02F 1/136286
2021/0376040 A1   12/2021 Youn, II et al.

FOREIGN PATENT DOCUMENTS

| | | | | |
|---|---|---|---|---|
| CN | 102540593 | A | 7/2012 | |
| CN | 104810002 | A | 7/2015 | |
| CN | 106226963 | A | 12/2016 | |
| CN | 108064405 | A * | 5/2018 | ............... G09F 9/30 |
| CN | 109634003 | A | 4/2019 | |
| CN | 110018595 | A | 7/2019 | |
| CN | 210223352 | U | 3/2020 | |
| CN | 111708238 | A | 9/2020 | |

OTHER PUBLICATIONS

CN_108064405_A_I-English (Year: 2018).*
CN 101510383 A (Year: 2009).*
CN 108064405 A English (Year: 2018).*
International Search Report in International application No. PCT/CN2022/080587, mailed on Sep. 27, 2022.
Written Opinion of the International Searching Authority in International application No. PCT/CN2022/080587, mailed on Sep. 27, 2022.
Chinese Office Action issued in corresponding Chinese Patent Application No. 202210215186.7 dated Jun. 11, 2025, pp. 1-11.

* cited by examiner

DISPLAY PANEL AND DISPLAY DEVICE

FIELD OF THE DISCLOSURE

The present disclosure relates to a display technology, and more particularly, to a display panel and a display device.

BACKGROUND

Conventionally, in the display device, the wires extend from the display region to the fan-out region to connect the wires to the terminals such that the driving chip could be connected to the display panel to drive the display panel. However, because the length of the wires is comparatively longer (from the display region to the fan-out region), the impedance of the wires of the wires is also larger. If the width of the wires is adjusted to be larger to reduce the impedance, then the width of the fan-out region becomes larger such that the side frame of the display device becomes larger.

In other words, in a conventional display device, it's difficult to deal with both the impedance and the size of the side frame of the display device.

SUMMARY

Technical Problem

One objective of an embodiment of the present disclosure is to provide a display panel and a display device, to achieve both a comparatively low impedance of the fan-out wire and a narrow side frame.

Technical Solution

According to an embodiment of the present disclosure, a display panel is disclosed.

The display panel comprises a display region and a fan-out region, positioned at a side of the display region.

The fan-out region comprises a bonding terminal and a fan-out wire connected to the bonding terminal. The fan-out wire comprises a first fan-out wire and a second fan-out wire, positioned at two side of the first fan-out wire. The second fan-out wire comprises a first part, a second part and a third part. The third part is connected to the bonding terminal. At least a part of the second part is bended in a direction away from the display region. A width of at least one of the first part, the second part and the third part is larger than a width of the first fan-out wires.

In some embodiments, the bonding terminal is arranged in an array. A distance between the bonding terminal and the display region is shorter than or equal to a distance between the display region and an outermost sub-wire of the second fan-out wire.

In some embodiments, the first part extends from a side close to the display region to a side away from the display region in a first angle. The third part extends along a direction vertical to an interface between the display region and the fan-out region. The second part connects the first part to the second part and is bended from a side close to the display region to a side away from the display region.

In some embodiments, the second fan-out wire comprises a plurality of sub-wires and each of the sub-wires has an identical width.

In some embodiments, each region of the first fan-out wire has an identical width. A width of the first part of the second fan-out wire is larger than a width of the first fan-out wire. A width of the third part of the second fan-out wire is equal to the width of the first fan-out wire.

In some embodiments, each part of the second part of the second fan-out wire has an identical width, and a width of the second part of the second fan-out wire is larger than or equal to the width of the first fan-out wire. The second fan-out wire comprises a first bending part and a second bending part, the first bending part is connected to the first part. The second bending part is connected to the third part, a width of the first bending part is larger than the width of the first fan-out wire, and a width of the second bending part is equal to the width of the first fan-out wire.

In some embodiments, the sub-wires have an identical spacing in-between. A spacing between two sub-wires of the second fan-out wire is larger than or equal to a spacing between two sub-wires of the first fan-out wire.

In some embodiments, a width of the second fan-out wire increases along a direction from an interface between the first fan-out wire and the second fan-out wire toward a position away from the first fan-out wire.

In some embodiments, each part of the first fan-out wire has an identical width. A width of the first part of the second fan-out wire is larger than a width of the first fan-out wire. A width of the third part of the second fan-out wire is equal to the width of the first fan-out wire. A width of the first part of the second fan-out wire increases along the direction from the interface between the first fan-out wire and the second fan-out wire toward the position away from the first fan-out wire.

In some embodiments, each part of the second part of the second fan-out wire has an identical width. A width of the second part of the second fan-out wire is equal to the width of the first fan-out wire. In another embodiments, each part of the second part of the second fan-out wire has an identical width, and a width of the second part of the second fan-out wire increases along the direction from the interface between the first fan-out wire and the second fan-out wire toward the position away from the first fan-out wire. The second fan-out wire comprises a first bending part and a second bending part, the first bending part is connected to the first part; the second bending part is connected to the third part, a width of the first bending part is larger than the width of the first fan-out wire, and a width of the second bending part is equal to the width of the first fan-out wire.

In some embodiments, a spacing between two sub-wires of the second fan-out wire increases along the direction from the interface between the first fan-out wire and the second fan-out wire toward the position away from the first fan-out wire.

In some embodiments, in an interfacing area between the first fan-out wire and the second fan-out wire, an impedance of a sub-wire of the first fan-out wire closest to the second fan-out wire is identical to an impedance of a sub-wire of the second fan-out wire having a largest distance away from the first fan-out wire.

In some embodiments, the first fan-out wire comprises a first sub-wire and a second sub-wire, the first sub-wire is positioned at the interfacing area between the first fan-out wire and the second fan-out wire and the second sub-wire is positioned at one side of the first fan-out wire facing away the second fan-out wire. A width of the first sub-wire is larger than a width of the second sub-wire. An impedance of the first sub-wire is equal to an impedance of a sub-unit of the second fan-out wire having the greatest distance from the first fan-out wire.

In some embodiments, the first fan-out wire comprises a fourth part and a fifth part. The fifth part is connected to the bonding terminal. The fourth part is connected to the fifth part. In the first sub-wire of the first fan-out wire, a width of at least of the fourth part and the fifth part is larger than a width of the second sub-wire of the first fan-out wire.

In some embodiments, in the first sub-wire of the first fan-out wire, a width of the fourth part is larger than a width of the second sub-wire of the first fan-out wire, and a width of the fifth part is equal to a width of the second sub-wire of the first fan-out wire. In some embodiments, the width of the fourth part is equal to the width of the fifth part, and the width of the fourth part is larger than the second sub-wire of the first fan-out wire.

According to another embodiment of the present disclosure, a display device is disclosed.

The display device includes a display panel and a driving chip. The display panel comprises a display region and a fan-out region, positioned at a side of the display region.

The fan-out region comprises a bonding terminal and a fan-out wire connected to the bonding terminal. The fan-out wire comprises a first fan-out wire and a second fan-out wire, positioned at two side of the first fan-out wire. The second fan-out wire comprises a first part, a second part and a third part. The third part is connected to the bonding terminal. At least a part of the second part is bended in a direction away from the display region. A width of at least one of the first part, the second part and the third part is larger than a width of the first fan-out wires.

In some embodiments, the bonding terminal is arranged in an array. A distance between the bonding terminal and the display region is shorter than or equal to a distance between the display region and an outermost sub-wire of the second fan-out wire.

In some embodiments, the first part extends from a side close to the display region to a side away from the display region in a first angle. The third part extends along a direction vertical to an interface between the display region and the fan-out region. The second part connects the first part to the second part and is bended from a side close to the display region to a side away from the display region.

In some embodiments, the second fan-out wire comprises a plurality of sub-wires and each of the sub-wires has an identical width.

In some embodiments, each region of the first fan-out wire has an identical width. A width of the first part of the second fan-out wire is larger than a width of the first fan-out wire. A width of the third part of the second fan-out wire is equal to the width of the first fan-out wire.

Advantageous Effect

According to an embodiment of the present disclosure, a display panel and a display device are disclosed. In this embodiment, the display panel comprises a display region and a fan-out region, positioned at a side of the display region. The fan-out region comprises a bonding terminal and a fan-out wire connected to the bonding terminal. The fan-out wire comprises a first fan-out wire and a second fan-out wire, positioned at two side of the first fan-out wire. The second fan-out wire comprises a first part, a second part and a third part. The third part is connected to the bonding terminal. At least a part of the second part is bended in a direction away from the display region. A width of at least one of the first part, the second part and the third part is larger than a width of the first fan-out wires. The width of the fan-out wire positioned at the outer side is increased such that the impedance of the outer fan-out wire could be reduced. Furthermore, the second part of the second fan-out wire is bended in a direction away from the display region. This means that the second part only occupies the right/left redundant space and thus the second fan-out wire consumes less space of the lower side frame and the width of the fan-out region decreases. Accordingly, the present disclosure could achieve both comparatively low impedance of the fan-out wire and a narrow side frame.

DETAILED DESCRIPTION OF PREFERRED EMBODIMENTS

To help a person skilled in the art better understand the solutions of the present disclosure, the following clearly and completely describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present disclosure.

According to an embodiment, a display panel and a display device are disclosed to achieve both a low impedance of the fan-out wire and a narrow side frame.

Figure 1:
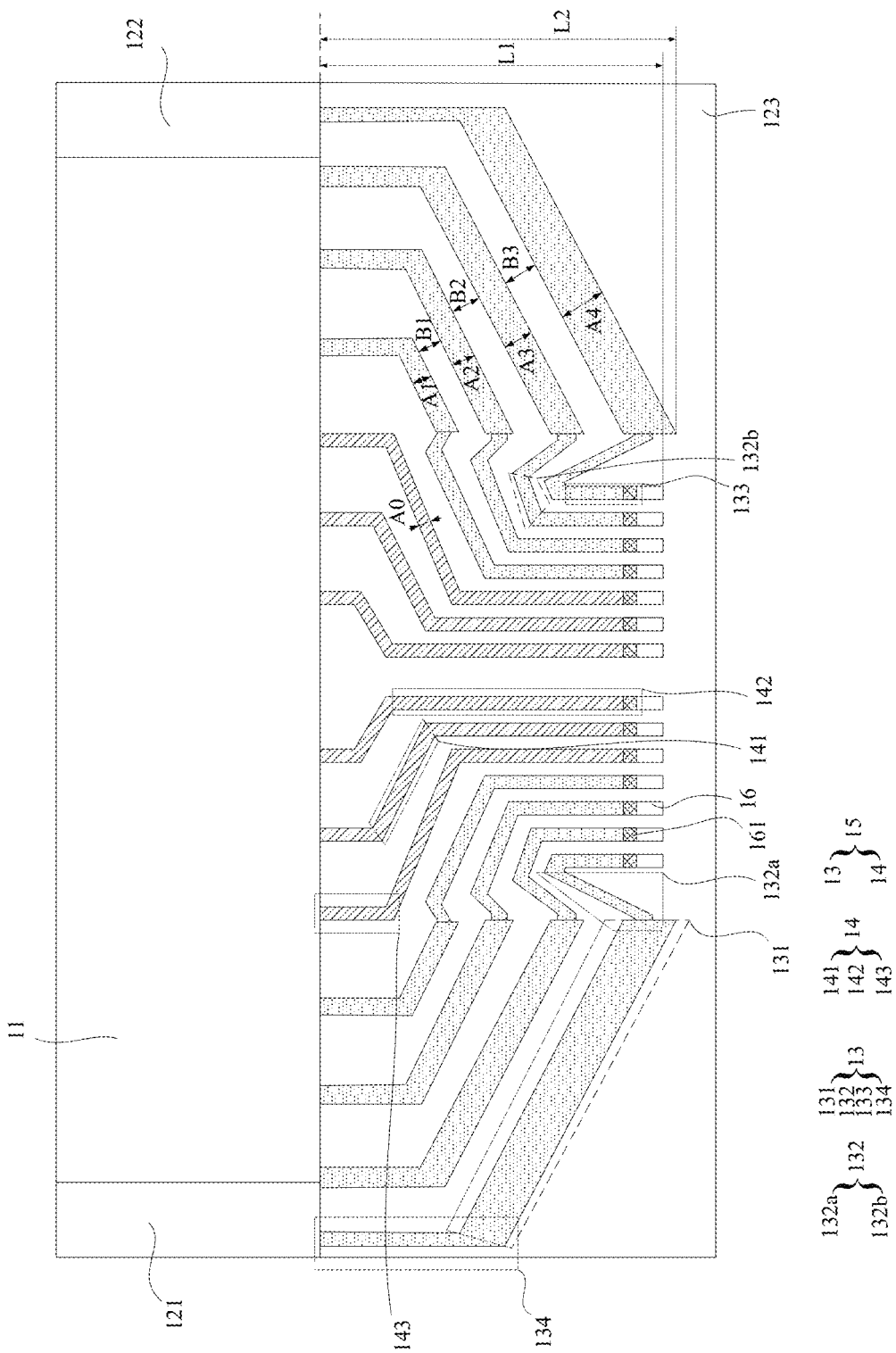
FIG. 1 is a diagram of a display panel according to a first embodiment of the present disclosure.

Please refer to FIG. 1. A display panel is disclosed. The display panel comprises a display region 11 and a fan-out region 123. The fan-out region 123 is positioned at one side of the display region 11.

The fan-out region 123 comprises a fan-out wire 15 and a bonding terminal 16. The fan-out wire 15 is connected to the bonding terminal 16. The fan-out wire 15 comprises a first fan-out wire 14 and a second fan-out wire 13. The second fan-out wire 13 is positioned at two sides of the first fan-out wire 14. The second fan-out wire 13 comprises a first part 131, a second part 132 and a third part 133. The second part 132 is positioned between the first part 131 and the second part 133. The third part 133 is connected to the bonding terminal 16. At least a part of the second part 132 is bended in a direction away from the display region 11. The width of at least one of the first part 131, the second part 132 and the third part 133 (for example, the width A4 of the second part 132 of the second fan-out wire 13 shown in FIG. 1) is larger than the width A0 of the first fan-out wires 14.

In this embodiment, the fan-out wire positioned in the outer region of the display panel has an increased width to reduce the impedance of the fan-out wire. Furthermore, the second part of the second fan-out wire is bended in a direction away from the display region. This allows the second part to occupy only the left/right redundant space and thus the second fan-out wire consumes less space of the lower side frame and the width of the fan-out region decreases. Accordingly, the present disclosure could achieve both comparatively low impedance of the fan-out wire and a narrow side frame.

Here, the display panel comprises a display region and a non-display region. The non-display region comprises a fan-out region. The non-display region comprises the fan-out region and a lower non-display region located below the fan-out region, a left non-display region, a right non-display region, and a top non-display region. Therefore, as shown in FIG. 1, the left non-display region 121 and the right non-display region 122 are depicted. However, this is not a limitation of the present disclosure. This means that the two non-display regions are just examples and not required in the present disclosure. The design of the non-display regions of the display panel could be determined according to the actual demands. The present disclosure merely requires the display region and the fan-out region.

When the fan-out wire is connected to the bonding terminal, the fan-out wire has a portion covering the bonding terminal. The covering portion belongs to the third part 133 as shown in FIG. 1. Accordingly, in FIG. 1, the number 161 is used to label the portion of the third part 133 covering the bonding terminal 16.

The display region comprises a middle region and edge regions. The first fan-out wire is placed near the middle region of the display region and the second fan-out wires is placed near the edge regions of the display region.

Figure 2:
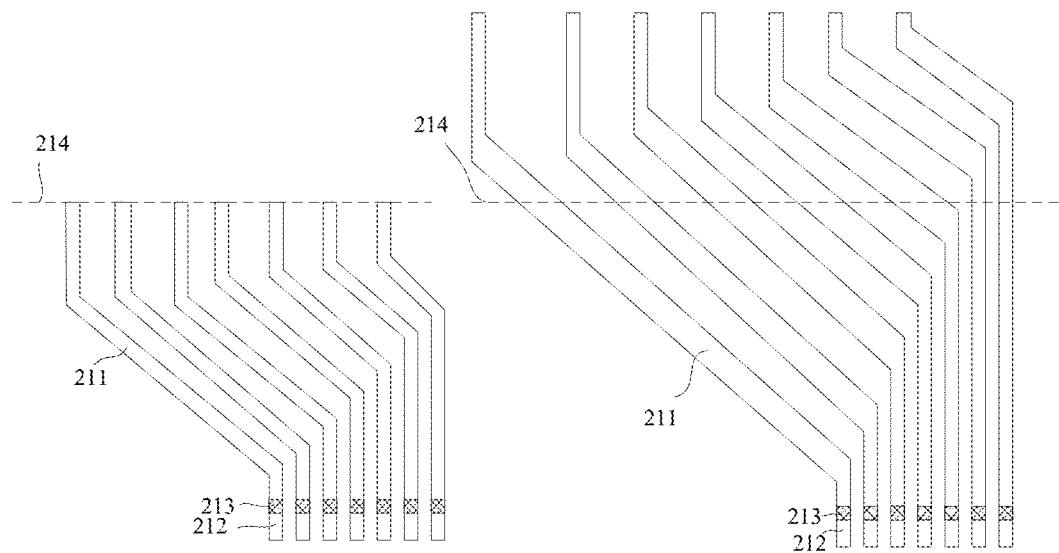
FIG. 2 is a diagram of a conventional display panel.

Please refer to FIG. 2. The conventional fan-out wire arrangement is shown and the interface between the display region and the fan-out region could be used to illustrate the occupied space of the fan-out wire. Please refer to the left figure in FIG. 2. When the width of the fan-out wire 211 remains the same and smaller and the spacing between the sub-wires of the fan-out wire 211 remains the same, the impedance is greater. The fan-out wire 211 is connected to the bonding terminal 212 and the number 213 is used to label the connecting part of the fan-out wire 211 and the bonding terminal. The fan-out wire could be all placed below the interface 214 between the display region and the fan-out region. Please refer to the right figure in FIG. 2. When the width of the fan-out wire 211 remains the same but larger. And the spacing between the sub-wires of the fan-out wire 211 remains the same, the impedance becomes smaller. However, it can be seen that the fan-out wire 211 exceeds the interface 214 between the display region and the fan-out region under the same side frame design. That is, in the actual design, the side frame needs to be larger. Thus, the conventional display device cannot achieve both the low impedance of the fan-out wire and the narrow side frame.

Please refer to FIG. 1 again. Taking the interface between the display region 11 and the fan-out region 123 as an example, the present disclosure increases the width of the fan-out wire and bends the fan-out wire toward the outer of the display region such that the fan-out wire could be folded at the left/right side of the redundant space. This means that the fan-out wire more occupies the right/left redundant space and thus consumes less space of the lower side frame. Therefore, the width of the lower side frame could be reduced, which means that the size of the lower side frame could be reduced. Accordingly, the present disclosure could achieve both the low impedance of the fan-out wire and the narrow side frame of the display device.

Please note, the present disclosure does not simply combine the conventional designs. That is, the present disclosure does not simply increase the width of the fan-out wire to reduce the impedance. Instead, the present disclosure redesign the arrangement of the fan-out wire and the spacing between the sub-wires of the fan-out wire to take care of both the low impedance of the fan-out wire and the narrow side frame of the display device.

As for the issue of a large side frame caused by increasing the width of the fan-out wire, please refer to FIG. 1 again. As shown in FIG. 1, the bonding terminal 16 is arranged in an array and the distance L1 between the bonding terminal 16 and the display region 11 is shorter than or equal to the distance L2 between the outermost sub-wire of the second fan-out wire 13 and the display region 11. Here, the second fan-out wire is bended toward the outside of the display region such that the first/second fan-out wire could occupy the right/left space. In this way, the bonding terminal could be upwardly placed. This could increase the width of the fan-out wire and reduce the size of the side frame. In other words, this could achieve the low impedance of the fan-out wire and the narrow side frame of the display device.

Because the parts of the outmost sub-line of the second fan-out wire have different distance from the display region, the maximum distance of the parts of the outmost sub-line of the second fan-out wire from the display region is taken as the distance between second fan-out wire and the display region. In the following disclosure, the distance between second fan-out wire and the display region will be defined as the same maximum distance and further illustration will be omitted for simplicity.

Specifically, since the width of the lower side frame of the fan-out region could be adjusted by adjusting the width of the fan-out wire, the size of the lower side frame of the fan-out region could be adjusted by adjusting the width of the fan-out wire. Furthermore, because the fan-out wire is bended toward the outside of the display region, the fan-out wire could occupy the right/left space. This arrangement could increase the width of the fan-out wire and reduce the size of the side frame. In other words, this could achieve the low impedance of the fan-out wire and the narrow side frame of the display device.

As shown in FIG. 1, the first part 131 extends from a side close to the display region 11 to a side away from the display region 11 in a first angle. The third part 133 extends along a direction vertical to the interface between the display region 11 and the fan-out region 123. The second part 132 connects the first part 131 to the second part 132 and is bended from a side close to the display region 11 to a side away from the display region 11. By bending the second part 132 from the side close to the display region 11 to the side away from the display region 11, the fan-out wire could occupy the right/left free space of the side frame instead of the lower side frame. Therefore, this arrangement could achieve the low impedance of the fan-out wire and the narrow side frame of the display device.

The first angle means the angle between the first part and the interface between the display region and the fan-out region. The first angle is determined by the width of the fan-out wire and the design and basically is determined for reducing the size of the side frame and the fan-out wire.

Figure 3:
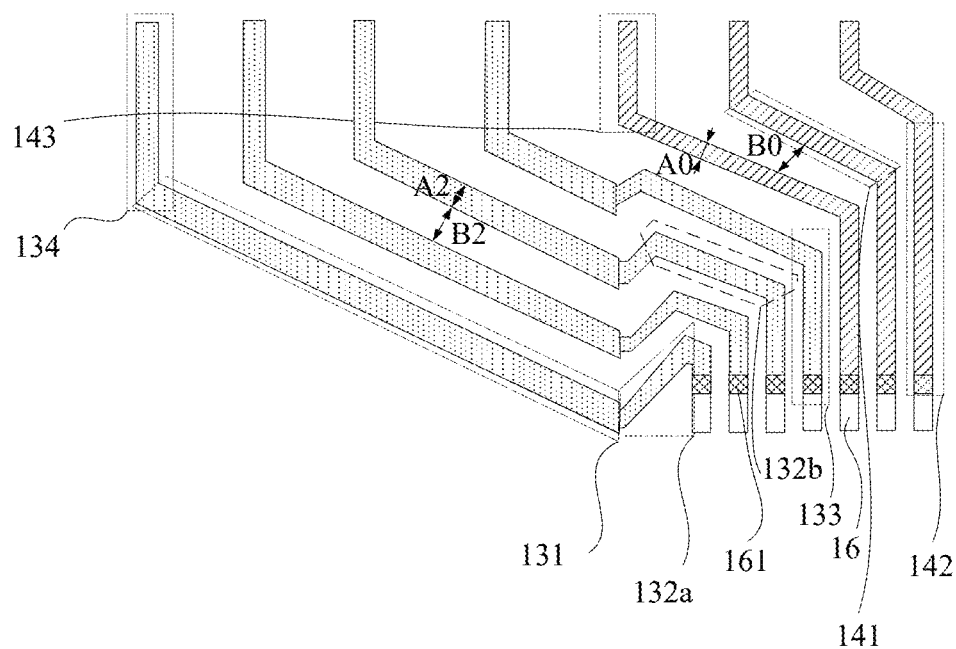
FIG. 3 is a diagram of a display panel according to a second embodiment of the present disclosure.

Please refer to FIG. 3. The second fan-out wire 13 comprises a plurality of sub-wires. Each of the sub-wires has an identical width. That is, in each of the sub-wires of the second fan-out wire 13 shown in FIG. 2, the width of its first part is the same, the width of its second part is the same, and the width of its third part is the same. By making the width of each sub-wire of the second fan-out wire identical, the impedance of each sub-wire could be lower and the width of each sub-wire could be reduced.

As for the conventional issue of increasing the width of the fan-out wire results in a larger size of the side frame, please refer to FIG. 3. In an embodiment, as shown in FIG. 3, each region of the first fan-out wire 14 has an identical width (that is, the width of the first part is identical, the width of the second part is identical, the width of the third part is identical, the width of the first part is equal to the width of the second part and the width of the second part is equal to the width of the third part). The width A2 of the first part 131 of the second fan-out wire 13 is larger than the width A0 of the first fan-out wire 14. The third part 133 of the second fan-out wire 13 is equal to the width A0 of the first fan-out wire 14. Because the length of the first part of the fan-out wire is often the longest part of the fan-out wire and the first part is often placed in a certain angle, increasing the width of the first part could well reduce the overall width of the fan-out wire. Furthermore, the increase of the width of the first part could result in the first part's usage of the horizontal space. Because the first part is placed with a slope, the usage of the horizontal space does not result in an increase of the side frame. By making the width of the third part equal to the width of the first fan-out wire, the occupied space of the third part could be reduced and the first part could use the space of the third part to reduce the size of the side frame. This achieves the low impedance of the fan-out wire and the narrow side frame of the display device.

In an embodiment, each region of the second part of the second fan-out wire has an identical width and the width of the second part of the second fan-out wire is larger than or equal to the width of the first fan-out wire.

Or, the second fan-out wire comprises a first bending part and a second bending part. The first bending part is connected to the first part. The second bending part is connected to the third part. The width of the first bending part is larger than the width of the first fan-out wire. The width of the second bending part is equal to the width of the first fan-out wire. By increasing the width of the second part of the second fan-out wire, the impedance of the second fan-out wire could be further reduced. In addition, when the width of the second part of the second fan-out wire is designed, the two bending parts could have different widths to reduce the impedance of the second fan-out wire.

As shown in FIG. 3, the second part 132 comprises a first bending part 132a and a second bending part 132b. The first bending part 132a and the second bending part 132b have the same width. The width of the first bending part is equal to the width of the first fan-out wire such that the width of the first fan-out wire is equal to the width of the second part. In this way, when the second part is placed, the overall width of the first fan-out wire and the second part could be reduced. This could save the space and reduce the size of the side frame of the display panel.

In the above embodiments, the width of the first bending part is larger than or equal to the second bending part. However, this is not a limitation. For example, the width of the second bending part could be larger than the first bending part.

As for the conventional issue of increasing the width of the fan-out wire results in a larger size of the side frame, please refer to FIG. 3. The spacing B2 between two sub-wires of the second fan-out wire is larger than or equal to the spacing B0 between two sub-wires of the first fan-out wire. By increasing the spacing between the sub-wires of the second fan-out wire and decreasing the spacing between the sub-wires of the first fan-out wire, the parasite capacitor in the second fan-out wire could be avoided when the second fan-out wire is arranged. Furthermore, it could avoid a short circuit in the second fan-out wire. In addition, a larger spacing could provide more space to the second part of the second fan-out wire such that the size of the side frame could be reduced.

The distance between the sub-wire of the first fan-out wire and the sub-wire of the second fan-out wire close to the interface between the first fan-out wire and the second fan-out wire could be set as the spacing between the sub-wires of the first fan-out wire and/or the spacing between the sub-wires of the second fan-out wire.

In an embodiment of the present disclosure, under the condition that the spacing between each part of the sub-wires of the second fan-out wire is identical, the spacing between the sub-wires of the second fan-out wire could be the spacing between the first parts of the sub-wires of the second fan-out wire, the spacing between the second parts of the sub-wires of the second fan-out wire, or the spacing between the third parts of the sub-wires of the second fan-out wire. Under the condition that the spacing between each part of the sub-wires of the second fan-out wire is not identical, the spacing between the sub-wires of the second fan-out wire means the spacing between the first parts of the sub-wires of the second fan-out wire. This will not be repeated again in the following disclosure for simplicity.

As shown in FIG. 3, by setting the spacing between the sub-wires of the first fan-out wire shorter than the spacing between the sub-wires of the second fan-out wire, because the first fan-out wire provides some spacing, the first part and the bending region of the second part of the second fan-out wire could use the spacing between the sub-wires of the first fan-out wire. Furthermore, the second fan-out wire could further use the horizontal regions. In this way, the size of the side frame could be reduced along with the decrease of the impedance of the fan-out wire.

As for the conventional issue of display unevenness due to different impedances of different wires, please refer to FIG. 1 again. In an embodiment, as shown in FIG. 1, the width of the second fan-out wire 13 increases along a direction from an interface between the first fan-out wire 14 and the second fan-out wire 13 toward a position away from the first fan-out wire 14 (for example, A1 is smaller than A2, A2 is smaller than A3, and A3 is smaller than A4). Along the direction from the first fan-out wire to the second fan-out wire, the width of the second fan-out wire orderly increases. This could make the impedance of the first fan-out wire closer to the impedance of the second fan-out wire while reducing the impedance of the second fan-out wire. Thus, it could alleviate the signal difference between different fan-out wires and improve the display unevenness.

As shown in FIG. 1, the lengths of the fan-out wire orderly increases from the center region to the two sides in the fan-out region. From the resistor formula, it could be understood that the resistance of the fan-out wire orderly increases under the basis that the fan-out wires have the same material. Therefore, as the width of the second fan-out wire orderly increases, the impedances of the sub-wires of the second fan-out wire become closer or even equal. Furthermore, the impedance of the second fan-out wire is close to or even equal to impedance of the first fan-out wire. Thus, the display evenness of the display panel is raised.

The width of each region of the first fan-out wire 14 is identical (that is, all regions of the first fan-out wire have the same width A0). The width of the first part 131 of the second fan-out wire 13 is larger than the width of the first fan-out wire 14 (for example, A1 is larger than A0). The width of the third part 133 of the second fan-out wire 13 is equal to the width of the first fan-out wire. Furthermore, the width of the first part 131 of the second fan-out wire 13 orderly increases from the interface between the first fan-out wire 14 and the second fan-out wire 13 to the place away from the first fan-out wire 14 (for example, A0 is smaller than A1, A1 is smaller than A2, A2 is smaller than A3, A3 is smaller than A4).

By setting the width of the third part equal to the width of the first fan-out wire, the spacing between the third part and the first fan-out wire could be set to be smaller such that the third part and the first fan-out wire could occupy a smaller space (including the horizontal and vertical space). This allows the first part and the second part to utilize this space to be bended or have a larger width such that the side frame could be smaller. Considering the first part of the fan-out wire is normally the longest part and the first part is much more than the third part, the width of the first part is set to be larger than the width of the first fan-out wire and the width of the first part orderly increases along the direction from the first fan-out wire toward a position away from the first fan-out wire. This could make the impedance of each sub-wire of the second fan-out wire close or even equal. Furthermore, the impedance of the second fan-out wire could be close to the impedance of the first fan-out wire. Accordingly, the display evenness of the display panel could be better.

In an embodiment, each region of the second part of the second fan-out wire has an identical width and the width of the second part of the second fan-out wire is equal to the width of the first fan-out wire; or each part of the second part of the second fan-out wire has an identical width, and a width of the second part of the second fan-out wire increases along the direction from the interface between the first fan-out wire and the second fan-out wire toward the position away from the first fan-out wire; or the second fan-out wire comprises a first bending part and a second bending part, the first bending part is connected to the first part; the second bending part is connected to the third part, the width of the first bending part is larger than the width of the first fan-out wire, and the width of the second bending part is equal to the width of the first fan-out wire.

By setting the width of the second part of the second fan-out wire equal to the width of the first fan-out wire, the width of the first part of the second fan-out wire is allowed to be larger. Furthermore, the width of the second part and the third part is equal to the width of the first fan-out wire. This could reduce the space occupied by the first fan-out wire and the second part and the third part of the second fan-out wire and provide some space for the enlarged first part. In this way, the side frame of the display panel could be reduced while reducing the impedance of the fan-out wire.

The width of the second fan-out wire orderly increases as it goes away from the first fan-out wire. Thus, the impedance of the sub-wires of the second fan-out wire becomes close or even equal. This improves the display evenness of the display panel.

The width of the first bending part is larger than the width of the second bending part. Accordingly, the width of the second bending part is not too large to occupy too much space. Furthermore, each sub-wire of the second fan-out wire could have a close or even identical impedance such that the display evenness of the display panel is improved.

In the above embodiments, the width of the first bending part is larger than the width of the second bending part. However, this is not a limitation of the present disclosure. For example, the width of the first bending part could be equal to or smaller to the second bending part. Or, the widths of the first bending part and the second bending part could orderly increase along the direction from the first fan-out wire toward the position away from the first fan-out wire.

As for the conventional issue of the increased size of the side frame due to the increase of the width of the fan-out wire, please refer to FIG. 1 again. In an embodiment, as shown in FIG. 1, the spacing between the sub-wires of the second fan-out wire 13 orderly increases along the direction from the interface between the first fan-out wire 14 and the second fan-out wire 13 to the position away from the first fan-out wire 14 (for example, B1 is smaller than B2 and B2 is smaller than B3). By making the spacing between the sub-lines of the second fan-out wire orderly increase, the parasite capacitors caused by the enlarged width of the second fan-out wire could be avoided when the second fan-out wire is arranged. In addition, the short circuit of the second fan-out wire could be avoided. Furthermore, a larger spacing could provide enough space for the second part of the second fan-out wire to reduce the side frame.

By increasing the spacing of the second fan-out wire, the transparent rate could be raised, the frame glue could be more easily molded and the yield could be raised in the manufacturing process of the display panel.

In an embodiment, the spacing between the first parts of the sub-wires of the second fan-out wire orderly increases along a direction from the interface between the first fan-out wire and the second fan-out wire toward a position of the first fan-out wire. In addition, the spacing between the second parts of the sub-wires of the second fan-out wire remains the same and the spacing between the third parts of the sub-wires of the second fan-out wire remains the same. Furthermore, the spacing between the second parts of the sub-wires of the second fan-out wire is equal to the spacing between the third parts of the sub-wires of the second fan-out wire. The spacing between the third parts of the sub-wires of the second fan-out wire is equal to the spacing between the sub-wires of the first fan-out wire. By increasing the spacing between the first parts and making the spacing between the second parts and the spacing between the third parts equal to the spacing between the sub-wires of the first fan-out wire, an enough space could be provided for bending the second part and putting the width of the first part. This achieves the low impedance of the fan-out wire and the narrow side frame of the display panel. Furthermore, the display evenness of the display panel is raised.

In the above embodiments, the present disclosure does not the angles for the first bending part and the second bending part to be bended. In the actual implementation, the angles of the first bending part and the second bending part could be determined by the number of the sub-wires of the fan-out wires, the side frame of the display panel, and the impedance of the fan-out wire. There is no need to limit the length as a certain length.

Furthermore, the present disclosure does not limit the length of the first bending part and/or the second bending part. In the actual implementation, the lengths of the first bending part and the second bending part could be determined by the number of the sub-wires of the fan-out wires, the side frame of the display panel, and the impedance of the fan-out wire. There is no need to limit the length as a certain length. For example, the length of the second part could be 1.6 mini-meter.

Figure 4:
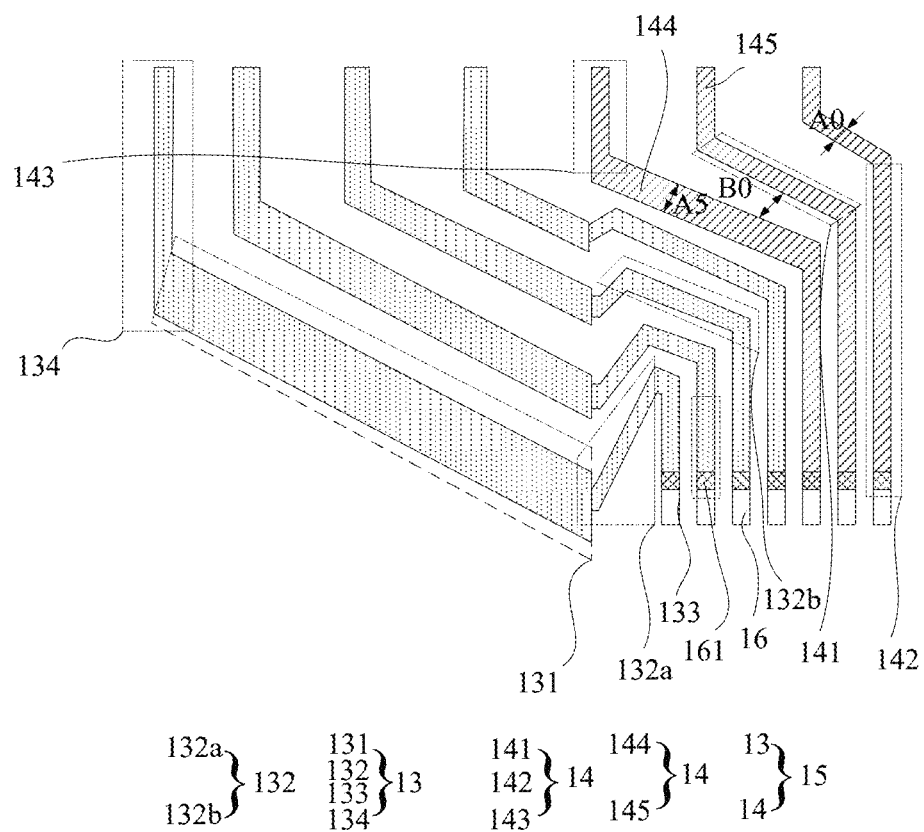
FIG. 4 is a diagram of a display panel according to a third embodiment of the present disclosure.

As for the issue that the impedance of the first fan-out wire will be larger than the impedance of the second fan-out wire when the width of the second fan-out wire is increased, please refer to FIG. 4. As shown in FIG. 4, in the interfacing area between the first fan-out wire and the second fan-out wire, the impedance of a sub-wire of the first fan-out wire closest to the second fan-out wire (the sub-wire 144) is identical to the impedance of the sub-wire of the second fan-out wire having a largest distance away from the first fan-out wire (the outmost sub-wire of the second fan-out wire in FIG. 4). When the width of the second fan-out wire is increased, the wire having the greatest impedance will be the sub-wire of the first fan-out wire located in the interfacing area between the first fan-out wire and the second fan-out wire and the outmost sub-wire of the second fan-out wire. Therefore, there is a need to make the impedances of these sub-wires equal such that each sub-wire of the fan-out wire could have an identical impedance. Furthermore, in this situation, the occupied space will be the smallest and the impedance of the fan-out wire could be decreased. The actual impedance could be determined according to the actual needs. In this way, the low impedance of the fan-out wire and the narrow side frame of the display panel could be both achieved. Furthermore, the display evenness of the display panel is raised.

From the above, the impedances of the sub-wire of the first fan-out wire located in the interfacing area between the first fan-out wire and the second fan-out wire and the outmost sub-wire of the second fan-out wire are set to be the same. This is because the present disclosure needs to deal with the low impedance of the fan-out wire and the narrow side frame of the display panel. Therefore, it cannot unlimitedly reduce the impedance of the second fan-out wire. That is, the present disclosure could reduce the impedance of the second fan-out wire as far as possible while reducing the size of the side frame such that the display evenness could be raised.

In the above embodiments, the sub-wires of the first fan-out wire have identical widths and spacing in-between. However, this is an example but not a limitation. For example, the width and/or the spacing in-between of the first fan-out wire could orderly increase. Furthermore, the first fan-out wire could also have a bending part, which is similar to the second fan-out wire. Because the first fan-out wire is comparatively shorter (which means that the impedance is lower), the impedance difference between sub-wires of the first fan-out wire is also smaller and the overall impedance is lower. Therefore, the spacing between the sub-wires of the first fan-out wire could be smaller and the second fan-out wire could be arranged to reduce the size of the side frame and reduce the impedance. This reduces the overall impedance of the fan-out wire and improves the display evenness.

As shown in FIG. 4, the first fan-out wire comprises a first sub-wire 144 and a second sub-wire 145. The first sub-wire 144 is positioned in the interfacing region of the first fan-out wire 14 and the second fan-out wire 13. The second sub-wire 145 is positioned at one side of the first fan-out wire facing away the second fan-out wire. The width A5 of the first sub-wire 144 is larger than the width A0 of the second sub-wire 145. The impedance of the first sub-wire 144 is equal to the impedance of a sub-unit of the second fan-out wire having the greatest distance from the first fan-out wire. By increasing the width of the first sub-wire, the impedance of the first sub-wire is reduced such that the impedance of the first sub-wire 144 is close or even equal to the impedance of a sub-unit of the second fan-out wire having the greatest distance from the first fan-out wire. This makes the impedance of each sub-wire of the first fan-out wire and the second fan-out wire close or even equal. This raises the display evenness of the display panel.

Specifically, by making the impedance of the first sub-wire equal to the impedance of the second fan-out wire, the first sub-wire and the second sub-wire could have similar impedances or an even identical impedance at the same time. Because the width of the fan-out wire could be orderly increased to make the impedance of the second fan-out wire close or even equal. Therefore, the present disclosure could make the impedance of the first fan-out wire equal to the impedance of the second fan-out wire such that the display evenness of the display panel is improved.

As shown in FIG. 4, the first fan-out wire 14 comprises a fourth part 141 and a fifth part 142. The fifth part 142 is connected to the bonding terminal. The fourth part 141 is connected to the fifth part 142. In the first sub-wire 144, at least one of the width of the fourth part and the width of the fifth part is larger than the width A0 of the second sub-wire 145. By increasing the width of at least one of the fourth part and the fifth part, the impedance of the first sub-wire could be reduced such that the impedance of the first sub-wire is close to or even equal to the impedance of the second fan-out wire. Accordingly, the display evenness of the display panel is raised.

In FIG. 3 and FIG. 4, only a part of the fan-out wire is shown. Because the fan-out wire is often symmetric, the other part of the fan-out wire could be arranged according to the arrangements shown in FIG. 3 and FIG. 4. Further illustrations are omitted here.

In the figures, some separation lines are shown to separate different parts of the sub-wire. However, in the actual implementation, the fan-out wire located in the same layer is manufactured with a same process and there would be no actual separation lines. The separation lines are just for readers' understanding in the figures and further illustrations are omitted here.

In an embodiment, in the first sub-wire, the width of the fourth part is larger than the width of the second sub-wire and the width of the fifth part is equal to the width of the second sub-wire. Or, the width of the fourth part is equal to the width of the fifth part, and the width of the fourth part is larger than the second sub-wire of the first fan-out wire. By making the width of the fourth part larger than the width of the second sub-wire, the impedance of the first sub-wire could be reduced. By making the width of the fifth part equal to the second sub-wire, the spacing between the first sub-wires and the side frame size is reduced. By making the widths of the fourth part and the fifth part both larger than the width of the second sub-wire, the width of the first sub-wire will be less enlarged to avoid the first sub-wire occupying too much space.

In an embodiment, in the first sub-wire, the width of the fourth part is equal to the width of the second sub-wire, and the width of the fifth part is larger than the width of the second sub-wire. By making the width of the fifth part larger than the width of the second sub-wire, the impedance of the first sub-wire is reduced.

In the above embodiments, the first sub-wire is one wire. But this is not a limitation. For example, the first sub-wire could comprise multiple wires.

The figures do not show the fan-out wire that is directly connected to the bonding terminal. However, the present disclosure does not limit the fan-out wire that is not connected to the bonding terminal. The fan-out wire could be limited to a part of the first fan-out wire and the arrangement could be the same as the arrangements of the first fan-out wire. Further illustrations are omitted here.

When the fan-out wire is connected to the wires in the display region, a wire vertical to the interface of the display region and the fan-out region in the fan-out region. That is, the fan-out wire may comprise a transition wire. In FIG. 1, the first fan-out wire 14 comprises a first transition wire 143 and the second fan-out wire 13 comprises a second transition wire 134. But this is not a limitation. For example, if the wire connected to the bonding terminal needs to be with a slope, then the wire could be set with a slope and there is no need to have such the transition wire. Only when all the fan-out wire is vertical to the interface of the display region and the fan-out region, the fan-out wire is directly connected to the bonding terminal. However, please note that in this case, there is no transition as well. For the fan-out wire having a transition wire, it will be illustrated in the following embodiments.

In an embodiment, the width of each first transition wire is identical and the width of each second transition wire is identical. The width of the second transition wire is larger than the width of the first transition wire. By increasing the width of the second transition wire, the impedance of the second fan-out wire is lower. This also allow the second fan-out wire to occupy a smaller space and thus the side frame of the display panel could be smaller.

In an embodiment, the width of each first transition wire is identical. The width of the second transition wire orderly increases along the direction from the first fan-out wire to the second fan-out wire. By orderly increasing the width of the second transition wire, the impedance of the second fan-out wire becomes close or even equal such that the display evenness is raised.

In the above embodiments, each part or multiple parts of the fan-out wire have been illustrated. However, the present disclosure does not limit the fan-out wire as a certain embodiment or as is shown in a certain figure. As long as there is no conflict, one or more features of one embodiment could be used in another embodiment, For example, the width of each region of the first fan-out wire is equal, the width of the first part of the second fan-out wire is larger than the width of the first fan-out wire, the width of the third part of the second fan-out wire is equal to the width of the first fan-out wire, the width of each first transition wire is equal, and the width of the second transition wire orderly increases along the direction from the first fan-out wire to the second fan-out wire. Further illustrations are omitted here.

In the above embodiments, the fan-out wire is illustrated. But there is no limitation on the types of the fan-out wire. For example, the fan-out wire could belong to a scan line or a data line. That is, all signals lines that have the fan-out wire could adopt the design of the above embodiments.

Furthermore, the present disclosure does not limit the film layer where the fan-out wire is located. For example, the fan-out wire could be placed in a source/drain layer or in multiple layers.

Figure 5:
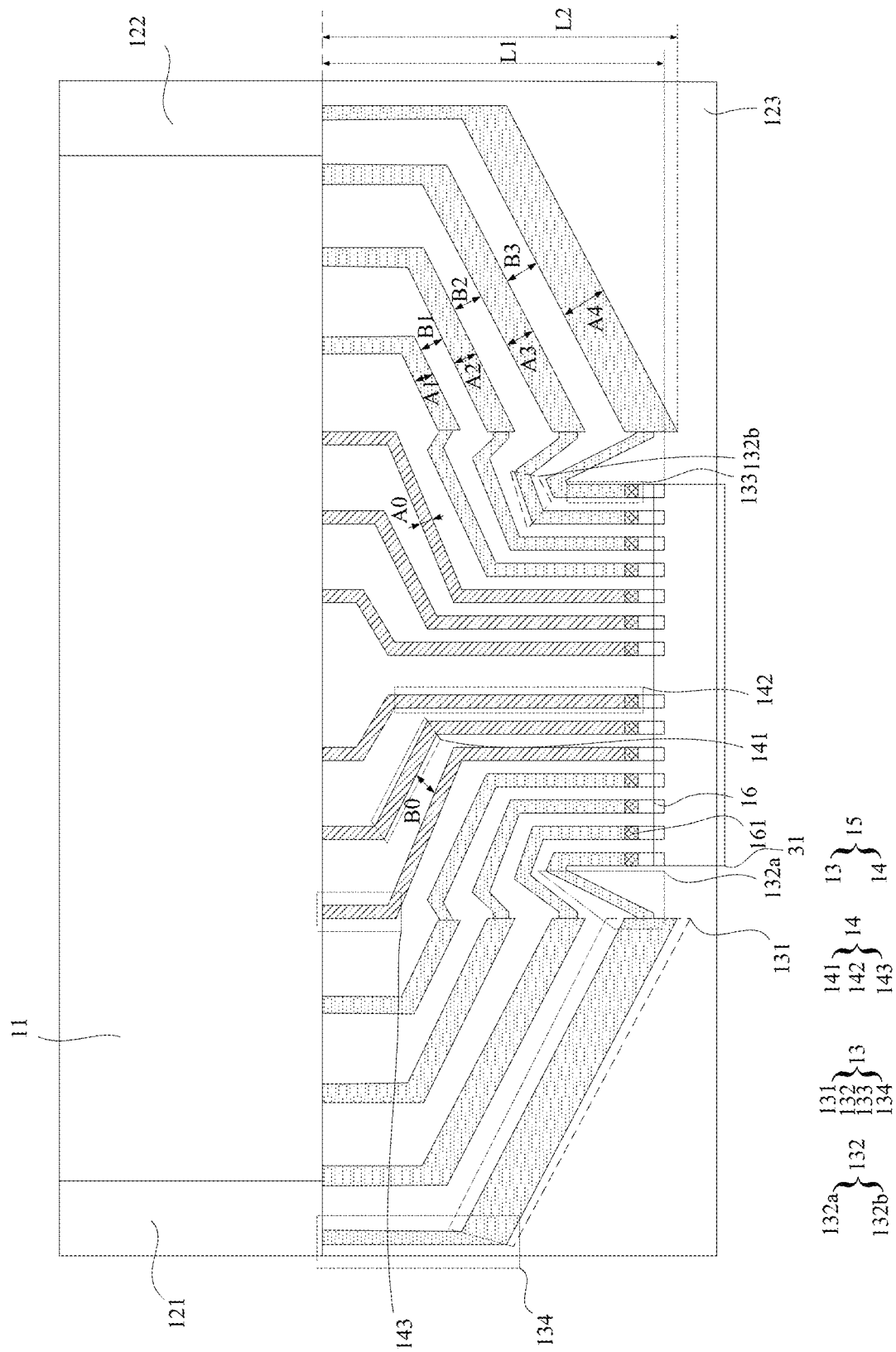
FIG. 5 is a diagram of a display device according to an embodiment of the present disclosure.

As shown in FIG. 5, a display device is disclosed. The display device comprises a display panel and a display chip 31.

The display panel comprises a display region 11 and a fan-out region 123, positioned at a side of the display region 11.

The fan-out region 123 comprises a bonding terminal 16 and a fan-out wire 15 connected to the bonding terminal 16. The fan-out wire 15 comprises a first fan-out wire 14 and a second fan-out wire 13, positioned at two side of the first fan-out wire 14. The second fan-out wire 13 comprises a first part 131, a second part 132 and a third part 133. The third part 133 is connected to the bonding terminal 16. At least a part of the second part 132 is bended in a direction away from the display region 11. A width of at least one of the first part 131, the second part 132, and the third part 133 (for example, the width A4 of the second part 132 of the second fan-out wire 13 shown in FIG. 1) is larger than a width A0 of the first fan-out wires 14.

According to an embodiment of the present disclosure, the width of the fan-out wire positioned at the outer side is increased such that the impedance of the outer fan-out wire could be reduced. Furthermore, the second part of the second fan-out wire is bended in a direction away from the display region. This means that the second part only occupies the right/left redundant space and thus the second fan-out wire consumes less space of the lower side frame and the width of the fan-out region decreases. Accordingly, the present disclosure could achieve both comparatively low impedance of the fan-out wire and a narrow side frame.

In some embodiments, the bonding terminal is arranged in an array. A distance between the bonding terminal and the display region is shorter than or equal to a distance between the display region and an outermost sub-wire of the second fan-out wire.

In some embodiments, the first part extends from a side close to the display region to a side away from the display region in a first angle. The third part extends along a direction vertical to an interface between the display region and the fan-out region. The second part connects the first part to the second part and is bended from a side close to the display region to a side away from the display region.

In some embodiments, the second fan-out wire comprises a plurality of sub-wires and each of the sub-wires has an identical width.

In some embodiments, each region of the first fan-out wire has an identical width. A width of the first part of the second fan-out wire is larger than a width of the first fan-out wire. A width of the third part of the second fan-out wire is equal to the width of the first fan-out wire.

According to an embodiment of the present disclosure, a display panel and a display device are disclosed. In this embodiment, the display panel comprises a display region and a fan-out region, positioned at a side of the display region. The fan-out region comprises a bonding terminal and a fan-out wire connected to the bonding terminal. The fan-out wire comprises a first fan-out wire and a second fan-out wire, positioned at two side of the first fan-out wire. The second fan-out wire comprises a first part, a second part and a third part. The third part is connected to the bonding terminal. At least a part of the second part is bended in a direction away from the display region. A width of at least one of the first part, the second part and the third part is larger than a width of the first fan-out wires. The width of the fan-out wire positioned at the outer side is increased such that the impedance of the outer fan-out wire could be reduced. Furthermore, the second part of the second fan-out wire is bended in a direction away from the display region. This means that the second part only occupies the right/left redundant space and thus the second fan-out wire consumes less space of the lower side frame and the width of the fan-out region decreases. Accordingly, the present disclosure could achieve both comparatively low impedance of the fan-out wire and a narrow side frame.

Above are embodiments of the present disclosure, which does not limit the scope of the present disclosure. Any modifications, equivalent replacements or improvements within the spirit and principles of the embodiment described above should be covered by the protected scope of the disclosure.

What is claimed is:

1. A display panel, comprising:
  a display region;
  a fan-out region, positioned at a side of the display region, the fan-out region comprising:
    a bonding terminal; and
    a fan-out wire, connected to the bonding terminal, the fan-out wire comprising:
      a first fan-out wire; and
      a second fan-out wire, positioned at two side of the first fan-out wire, the second fan-out wire comprises a first part, a second part and a third part;
      wherein the third part is connected to the bonding terminal; at least a part of the second part is bended in a direction away from the display region; and a width of at least one of the first part, the second part and the third part is larger than a width of the first fan-out wires;
  wherein the bonding terminal is arranged in an array, and a distance between the bonding terminal and the display region is shorter than or equal to a distance between the display region and an outermost sub-wire of the second fan-out wire; and
  wherein the first fan-out wire comprises a plurality of sub-wires, the second fan-out wire comprises a plurality of sub-wires, a spacing between first parts of the sub-wires of the second fan-out wire orderly increases along a direction from an interface between the first fan-out wire and the second fan-out wire toward a position of the first fan-out wire, a spacing between second parts of the sub-wires of the second fan-out wire remains the same, a spacing between third parts of the sub-wires of the second fan-out wire remains the same, the spacing between the second parts of the sub-wires of the second fan-out wire is equal to the spacing between the third parts of the sub-wires of the second fan-out wire, and the spacing between the third parts of the sub-wires of the second fan-out wire is equal to a spacing between the sub-wires of the first fan-out wire.

2. The display panel of claim 1, wherein the first part extends from a side close to the display region to a side away from the display region in a first angle; the third part extends along a direction vertical to an interface between the display region and the fan-out region; and the second part connects the first part to the second part and is bended from a side close to the display region to a side away from the display region.

3. The display panel of claim 1, wherein each of the sub-wires has an identical width.

4. The display panel of claim 3, wherein each region of the first fan-out wire has an identical width; a width of the first part of the second fan-out wire is larger than a width of the first fan-out wire; and a width of the third part of the second fan-out wire is equal to the width of the first fan-out wire.

5. The display panel of claim 4, wherein each part of the second part of the second fan-out wire has an identical width, and a width of the second part of the second fan-out wire is larger than or equal to the width of the first fan-out wire; or
  wherein the second fan-out wire comprises a first bending part and a second bending part, the first bending part is connected to the first part; the second bending part is connected to the third part, a width of the first bending part is larger than the width of the first fan-out wire, and a width of the second bending part is equal to the width of the first fan-out wire.

6. The display panel of claim 4, wherein the second part of the second fan-out wire comprises a first bending part and a second bending part, the first bending part has a same width as the second bending part, and a width of the first bending part is equal to the width of the first fan-out wire.

7. The display panel of claim 3, wherein the sub-wires have an identical spacing in-between; and a spacing between two sub-wires of the second fan-out wire is larger than or equal to a spacing between two sub-wires of the first fan-out wire.

8. The display panel of claim 1, wherein a width of the second fan-out wire increases along a direction from an interface between the first fan-out wire and the second fan-out wire toward a position away from the first fan-out wire.

9. The display panel of claim 8, wherein each part of the first fan-out wire has an identical width; a width of the first part of the second fan-out wire is larger than a width of the first fan-out wire; a width of the third part of the second fan-out wire is equal to the width of the first fan-out wire; and a width of the first part of the second fan-out wire increases along the direction from the interface between the first fan-out wire and the second fan-out wire toward the position away from the first fan-out wire.

10. The display panel of claim 9, wherein each part of the second part of the second fan-out wire has an identical width; and a width of the second part of the second fan-out wire is equal to the width of the first fan-out wire; or
  wherein each part of the second part of the second fan-out wire has an identical width, and a width of the second part of the second fan-out wire increases along the direction from the interface between the first fan-out wire and the second fan-out wire toward the position away from the first fan-out wire; or
  wherein the second fan-out wire comprises a first bending part and a second bending part, the first bending part is connected to the first part; the second bending part is connected to the third part, a width of the first bending part is larger than the width of the first fan-out wire, and a width of the second bending part is equal to the width of the first fan-out wire.

11. The display panel of claim 8, wherein a spacing between two sub-wires of the second fan-out wire increases along the direction from the interface between the first fan-out wire and the second fan-out wire toward the position away from the first fan-out wire.

12. The display panel of claim 1, wherein in an interfacing area between the first fan-out wire and the second fan-out wire, an impedance of a sub-wire of the first fan-out wire closest to the second fan-out wire is identical to an impedance of a sub-wire of the second fan-out wire having a largest distance away from the first fan-out wire.

13. The display panel of claim 12, wherein the first fan-out wire comprises a first sub-wire and a second sub-wire, the first sub-wire is positioned at the interfacing area between the first fan-out wire and the second fan-out wire and the second sub-wire is positioned at one side of the first fan-out wire facing away the second fan-out wire; a width of the first sub-wire is larger than a width of the second sub-wire; and an impedance of the first sub-wire is equal to an impedance of a sub-unit of the second fan-out wire having the greatest distance from the first fan-out wire.

14. The display panel of claim 13, wherein the first fan-out wire comprises a fourth part and a fifth part; the fifth part is connected to the bonding terminal; the fourth part is connected to the fifth part; in the first sub-wire of the first fan-out wire, a width of at least of the fourth part and the fifth part is larger than a width of the second sub-wire of the first fan-out wire.

15. The display panel of claim 14, wherein in the first sub-wire of the first fan-out wire, a width of the fourth part is larger than a width of the second sub-wire of the first fan-out wire, and a width of the fifth part is equal to a width of the second sub-wire of the first fan-out wire; or wherein the width of the fourth part is equal to the width of the fifth part, and the width of the fourth part is larger than the second sub-wire of the first fan-out wire.

16. A display device, comprising:
a driving chip; and
a display panel, comprising:
  a display region;
  a fan-out region, positioned at a side of the display region, the fan-out region comprising:
  a bonding terminal; and
  a fan-out wire, connected to the bonding terminal, the fan-out wire comprising:
    a first fan-out wire; and
    a second fan-out wire, positioned at two side of the first fan-out wire, the second fan-out wire comprises a first part, a second part and a third part;
    wherein the third part is connected to the bonding terminal; at least a part of the second part is bended in a direction away from the display region; and a width of at least one of the first part, the second part and the third part is larger than a width of the first fan-out wires;
wherein the bonding terminal is arranged in an array, and a distance between the bonding terminal and the display region is shorter than or equal to a distance between the display region and an outermost sub-wire of the second fan-out wire; and wherein the first fan-out wire comprises a plurality of sub-wires, the second fan-out wire comprises a plurality of sub-wires, a spacing between first parts of the sub-wires of the second fan-out wire orderly increases along a direction from an interface between the first fan-out wire and the second fan-out wire toward a position of the first fan-out wire, a spacing between second parts of the sub-wires of the second fan-out wire remains the same, a spacing between third parts of the sub-wires of the second fan-out wire remains the same, the spacing between the second parts of the sub-wires of the second fan-out wire is equal to the spacing between the third parts of the sub-wires of the second fan-out wire, and the spacing between the third parts of the sub-wires of the second fan-out wire is equal to a spacing between the sub-wires of the first fan-out wire.

17. The display device of claim 16, wherein the first part extends from a side close to the display region to a side away from the display region in a first angle; the third part extends along a direction vertical to an interface between the display region and the fan-out region; and the second part connects the first part to the second part and is bended from a side close to the display region to a side away from the display region.

18. The display device of claim 16, wherein each of the sub-wires has an identical width.

19. The display device of claim 18, wherein each region of the first fan-out wire has an identical width; a width of the first part of the second fan-out wire is larger than a width of the first fan-out wire; and a width of the third part of the second fan-out wire is equal to the width of the first fan-out wire.

* * * * *